United States Patent
Pen

(10) Patent No.: US 9,040,339 B2
(45) Date of Patent: May 26, 2015

(54) PRACTICAL METHOD OF PRODUCING AN AEROGEL COMPOSITE CONTINUOUS THIN FILM THERMOELECTRIC SEMICONDUCTOR MATERIAL

(71) Applicant: The Pen, West Hollywood, CA (US)

(72) Inventor: The Pen, West Hollywood, CA (US)

( * ) Notice: Subject to any disclaimer, the term of this patent is extended or adjusted under 35 U.S.C. 154(b) by 10 days.

(21) Appl. No.: 14/042,729

(22) Filed: Oct. 1, 2013

(65) Prior Publication Data
US 2015/0093850 A1    Apr. 2, 2015

(51) Int. Cl.
| | | |
|---|---|---|
| H01L 21/00 | (2006.01) | |
| H01L 35/34 | (2006.01) | |
| H01L 35/16 | (2006.01) | |
| H01L 35/18 | (2006.01) | |
| H01L 35/22 | (2006.01) | |

(52) U.S. Cl.
CPC ............... *H01L 35/34* (2013.01); *H01L 35/16* (2013.01); *H01L 35/18* (2013.01); *H01L 35/22* (2013.01)

(58) Field of Classification Search
CPC .......... H01L 35/16; H01L 35/18; H01L 35/22
USPC .......................................................... 438/54
See application file for complete search history.

(56) References Cited

U.S. PATENT DOCUMENTS

| | | |
|---|---|---|
| 6,509,520 B1 | 1/2003 | Kyle et al. |
| 7,461,512 B2 | 12/2008 | Sakamoto et al. |
| 8,231,240 B1 | 7/2012 | Rubio et al. |
| 2005/0150535 A1 | 7/2005 | Samavedam et al. |
| 2005/0150536 A1 | 7/2005 | Ngai |
| 2005/0150539 A1 | 7/2005 | Ghoshal et al. |
| 2005/0247337 A1 | 11/2005 | Chen et al. |
| 2006/0076046 A1 | 4/2006 | Ghoshal et al. |
| 2006/0088271 A1 | 4/2006 | Ghoshal |
| 2006/0157101 A1 | 7/2006 | Sakamoto et al. |
| 2008/0022695 A1 | 1/2008 | Welle et al. |
| 2008/0022696 A1 | 1/2008 | Welle et al. |
| 2009/0205696 A1 | 8/2009 | Koester et al. |
| 2010/0024437 A1 | 2/2010 | Elsner et al. |
| 2010/0229911 A1 | 9/2010 | Leavitt et al. |
| 2011/0083711 A1 | 4/2011 | Plissonnier |
| 2011/0083713 A1 | 4/2011 | Narducci |

(Continued)

FOREIGN PATENT DOCUMENTS

| | | |
|---|---|---|
| CA | 2757528 A1 | 10/2010 |
| CA | 2757530 A1 | 10/2010 |

(Continued)

OTHER PUBLICATIONS

S. Ganguly, S. L. Brock, "Toward Nanostructured Thermoelectrics: Synthesis and Characterization of Lead Telluride Gels and Aerogels", Journal of Materials Chemistry, 2011, 21, 8800-8806.

(Continued)

*Primary Examiner* — Ajay K Arora

(57) ABSTRACT

A method is disclosed of constructing a composite material structure, comprised of an aerogel precursor foundation, which is then overlaid throughout its interior with an even and continuous thin layer film of doped thermoelectric semiconductor such that electrical current is transmitted as a quantum surface phenomena, while the cross-section for thermal conductivity is kept low, with the aerogel itself dissipating that thermal conductivity. In one preferred embodiment this is achieved using a modified successive ionic layer adsorption and reaction in the liquid phase.

20 Claims, 1 Drawing Sheet

(56) References Cited

U.S. PATENT DOCUMENTS

| | | |
|---|---|---|
| 2011/0139207 A1 | 6/2011 | Edwards |
| 2011/0260800 A1 | 10/2011 | Shanfield et al. |
| 2012/0024332 A1 | 2/2012 | Stefan et al. |
| 2012/0103381 A1 | 5/2012 | Leavitt et al. |
| 2012/0192574 A1 | 8/2012 | Ghoshal et al. |
| 2012/0301360 A1 | 11/2012 | Meinhold et al. |
| 2013/0202890 A1* | 8/2013 | Kong et al. .......... 428/402 |

FOREIGN PATENT DOCUMENTS

| | | |
|---|---|---|
| CA | 2802346 A1 | 12/2011 |
| CN | 100413392 C | 8/2008 |
| CN | 1909955 B | 11/2010 |
| DE | 19527465 C2 | 9/1998 |
| EP | 0912329 A1 | 5/1999 |
| EP | 1926155 B1 | 10/2010 |
| EP | 2277209 A2 | 1/2011 |
| EP | 2315987 A2 | 5/2011 |
| EP | 2330181 A1 | 6/2011 |
| EP | 2436043 A2 | 4/2012 |
| EP | 2454549 A1 | 5/2012 |
| EP | 2457270 | 5/2012 |
| EP | 2508044 A1 | 10/2012 |
| EP | 2583014 A2 | 4/2013 |
| EP | 2630669 A2 | 8/2013 |
| WO | 2005071765 B1 | 9/2005 |
| WO | 2006047235 A2 | 5/2006 |
| WO | 2008057914 A2 | 5/2008 |
| WO | 2008130431 | 10/2008 |
| WO | 2009151251 A2 | 12/2009 |
| WO | 2010065121 | 6/2010 |
| WO | 2010085767 A1 | 7/2010 |
| WO | 2010085769 A1 | 7/2010 |
| WO | 2010147638 A2 | 12/2010 |
| WO | 2011007241 A1 | 1/2011 |
| WO | 2011009935 A1 | 1/2011 |
| WO | 2011012549 A1 | 2/2011 |
| WO | 2013050961 A1 | 4/2013 |
| WO | 2013119287 A1 | 8/2013 |
| WO | 2013119293 A2 | 8/2013 |

OTHER PUBLICATIONS

S. Ganguly, C. Zhou, D. Morelli, J. Sakamoto, S. L. Brock, "Synthesis and Characterization of Telluride Aerogels: Effect of Gelation on Thermoelectric Performance of $Bi_2Te_3$ and $Bi_{2-x}Sb_xTe_3$ Nanostructures", Journal of Physical Chemistry C, 2012, 116 (33), 17431-17439.

J. Xie, A. Frachioni, D. S. Williams, B. E. White, Jr. "Thermal conductivity of a ZnO nanowire/silica aerogel nanocomposite", Applied Physics Letters, 2013, 102, 193101.

* cited by examiner

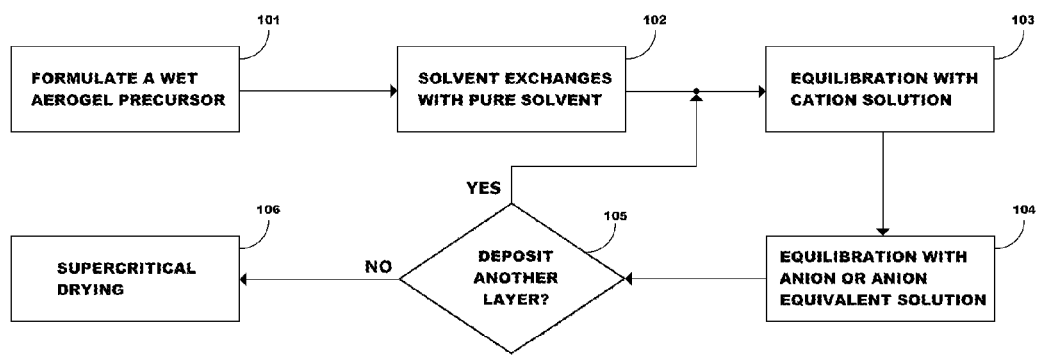

PRACTICAL METHOD OF PRODUCING AN AEROGEL COMPOSITE CONTINUOUS THIN FILM THERMOELECTRIC SEMICONDUCTOR MATERIAL

COPYRIGHT NOTICE

A portion of the disclosure of this patent document contains material which is subject to copyright protection. The copyright owner has no objection to the facsimile reproduction by anyone of the patent document or the patent disclosure as it appears in the Patent and Trademark Office Patent file or records, but otherwise reserves all copyrights whatsoever.

BACKGROUND

With the looming threat of global warming climate change driven by exponentially increasing levels of carbon dioxide in the atmosphere, there is an urgent need to develop new carbon neutral energy production technologies. Even the best of current photovoltaic solar cell technologies in development capture less than half of the available solar energy. Indeed, one of the issues is how to dissipate the "waste" heat in such systems. Thermoelectric modules convert heat to electricity, but demonstrated efficiencies have lagged behind the photovoltaics. If efficiencies could be boosted they would become more attractive for backing up existing photovoltaics as a second power generation stage, or for use standing alone.

Thermoelectric efficiency is proportional to electric conductivity and inversely proportional to thermal conductivity. These two conductivities tend to be related, so the challenge has been to formulate or construct materials where the first is boosted while the second is reduced. Aerogel materials are known for their exceptionally low heat conductivity, and it was hoped that aerogels derived from the best performing thermoelectric bulk materials as a single formula component would offer much better performance, but results have not yet met those high expectations.

OBJECTIVES OF THIS INVENTION

This application teaches how to construct a composite material structure, comprised of an aerogel foundation, in one embodiment silica based, which is then overlaid throughout its interior with an even and continuous thin layer film of doped thermoelectric semiconductor. In this way electrical current is transmitted as a quantum surface phenomena, while the cross-section for thermal conductivity is kept low, with the aerogel itself dissipating that thermal conductivity.

For much the same reason that aerogels are such superb heat insulators, materials in solution diffuse slowly in and out of the wet gel precursors (before supercritical drying) of aerogels. To solve the problem of how to evenly coat the aerogel substructure throughout its interior with the thermoelectric thin layer, this application teaches in one embodiment a materially modified successive ionic layer adsorption and reaction ("SILAR") process where a wet aerogel precursor is allowed to alternatively equilibrate, first in solutions of metal or metalloid (poor metal) cations, and then in solutions of non-metal or metalloid anions or anion equivalents, where if these solutions were mixed directly they would deposit insoluble material on the first exterior surface they encounter, or as colloidal nanoparticles that eventually precipitate.

BRIEF DESCRIPTION OF THE DRAWING

FIG. 1 is a flow diagram illustrating the reaction and processing steps executed in the application of a specific embodiment of the present invention

PRIOR ART

Others have proposed different constructions which are easily distinguishable, for example coating semiconductor nanowires with aerogel [*Appl. Phys. Lett.* (2013) 102:193101, EP 2277209 A2.CA 2757528 A1, US 20110083713 A1]. filling the spaces between or around fabricated thermoelectric elements with insulating aerogel filler [EP 2454549 A1, CA 2757530 A1, WO 2005071765 B1, WO 2013119293 A2, EP 2630669 A2, WO 2013119287 A1, EP 2457270 A1, WO 2013050961 A1, WO 2011009935 A1, EP 1926155 B1, EP 2436043 A2, WO 2011012549 A1, U.S. Pat. No. 6,509,520 B1, EP 2315987 A2, WO 2006047235 A2, US 20060157101 A1, US 20120024332 A1, EP 2583014 A2, US 20080022696 A1, EP 2508044 A1, US 20080022695 A1, US 20100024437 A1, US 20110260800 A1, US 20110083711 A1, US 20100229911 A1, US 20120103381 A1, WO 2008057914 A2, WO 2010085769 A1, WO 2010085767 A1, EP 2330181 A1, DE 19527465 C2, US 20090205696 A1, US 20060076046 A1, US 20110083713 A1, EP 0912329 A1, US 20120192574 A1, US 20050247337 A1, U.S. Pat. No. 8,231, 240 B1, CA 2802346 A1, US 20060088271 A1}, using aerogels as insulating films, [WO 2011007241 A1, U.S. Pat. No. 7,461,512 B2, CN 100413392 C, WO 2009151251 A2, US 20050150535 A1, US 20050150539 A1, US 20050150536 A1], constructing an aerogel from a thermoelectric material alone [*J. Phys. Chem. C*, (2012) 116:33:17431-17439, J. Mater. Chem. (2011) 21:8800-8806, WO 2010065121 A1], or dispersing thermoelectric nanoparticles or other elements in an aerogel matrix (for non-power generation purposes) [US 20120301360 A1, WO 2010147638 A2, WO 2008130431 A2, CN 1909955 B].

US patent application 2007/0277866 ("Edwards"), same as foreign applications WO 2009140730 A1 and EP 2297795 A1, purports to describe a "thermoelectric element comprising a porous substrate," which substrate might be an aerogel, "coated with one or more materials, at least one of which is a thermoelectric material." [Edwards claims 1, 20] (Other references in brackets below are to paragraphs, examples and claims in the Edwards application.)

However, Edwards offers no actual practical method for achieving, with an aerogel in particular, the even and continuous thin film layer throughout its interior as described in this application. Edwards concedes that his preferred technique, atomic layer deposition ("ALD"), defined by him as being done in the gas phase, is greatly problematic when applied to so-called porous materials of any thickness. [0070], [0073] This is especially so in the case of an aerogel which despite its many pores is relatively impermeable to free gas "flow-through."

Disclosing in addition only "chemical vapour deposition, physical vapour deposition, electron evaporation, sputtering and variations of these," [0059] all of which are wholly inappropriate for application to an aerogel, Edwards expressly rejected out of hand any solvent based reaction method. [0015] Contrary to his assumptions, it is the ALD approach, as currently practiced, which is the less practical one for aerogels. But even if Edwards had seriously considered some manner of chemical bath deposition, no existing such protocol could achieve the end product described herein, without the novel and material modifications disclosed by this application, designed specifically to achieve these new aerogel composite materials. For all these reasons, Edwards' evocation that, "The thermoelectric material may be deposited on the substrate using any technique known to be suitable to a person skilled in the art," is not availing to overcome the claims of this applicant.

The method of one embodiment of this invention is further distinguished from Edwards in that the semiconductor material is applied to a wet aerogel precursor (properly described as a hydrogel or alcogel), not an aerogel or xerogel (as they are called in their dried states) as named by Edwards. Liquid water is in fact destructive of many aerogels once they are dried, due to the capillary forces created.

To try to overcome the limitations of his own method, Edwards chose to work with the thinnest possible aerogels, no more than 250 micrometers in thickness (about 3 sheets of paper), and even to do that it was required to reinforce the aerogel with fiberglass fibers. [Example 12] This of course greatly defeats the primary theoretical purpose of an aerogel in such a construction, by increasing its naturally minimal thermal conductivity, the very quality which would recommend its use. And Edwards further concedes that making devices thinner than 1-2 mm in thickness incurs higher heat flow (destructive of thermoelectric efficiency), [0011] and offers no claim even that his thin aerogel materials achieve "uniform" coating. Edwards only offers that he "surprisingly found" that they had any thermoelectric properties at all, [0073] apparently not even as good as those achieved by him with cellulose substrates under identical conditions, [comparing Examples 4, 13] proving that he was able to gain no utilitarian advantage from the use of aerogel.

In short, Edwards' use of the words "coated" on its "surface", [Claim 1] even modified by the word "completely", [Claim 2] is insufficiently specific to describe the product material claimed by this application. with the thermoelectric material distributed in an aerogel by a thin layer film evenly throughout its interior, and none of Edwards' "method" claims, nor does his specification, include any procedural details which might actually enable its practical production.

As contrasted by the following:
Sample Experimental Procedure

A 40% solution of sodium silicate (waterglass) is added to a 1M solution of HCl until the pH is increased to 3.5, FIG. 1, 101. This solution is then poured into, and only to fill to a shallow depth, 10 ml teflon beakers, and allowed to sit overnight at room temperature to set as hydrogel disks, and to shrink slightly as they cure. Using distilled, de-ionized water, an aqueous cation solution is prepared 0.025 molar in antimony acetate, 0.019 molar in zinc acetate, 0.006 molar in bismuth acetate and 0.1 molar in triethanolamine. Likewise, an aqueous anion solution is prepared 0.066 molar in thioacetamide. The wet hydrogel disk is transferred to a teflon crumb cup, drained quickly, and which is then placed in a larger teflon beaker of pure water and allowed to equilibrate overnight, and this is repeated twice more with fresh water, 102. The hydrogel in the crumb cup is then transferred alternately first to a teflon beaker containing the cation solution and allowed to equilibrate, 103, and then to a teflon beaker of the anion solution to equilibrate, again overnight, 104. The gel can be rinsed quickly with water in the transfer between solutions to avoid stray precipitation in them. This cycle of alternate solutions is repeated until the desired thin film layer of cation/anion compound is deposited, 105. The hydrogel disc is allowed to equilibrate three times with pure water and then three times with anhydrous ethanol. The now ethanol saturated gel disc is placed in a Tousimis Samdri supercritical point dryer, allowed to equilibrate with liquid carbon dioxide overnight three times, and the last carbon dioxide rinse is bled off slowly maintaining a temperature above 31.1 C and a pressure above 72.9 atmospheres to achieve the supercritical drying process, 106.

DESCRIPTION

The above procedure is intended primarily as a demonstration of the fabrication method of this invention. One skilled in the art might vary the time duration of the equilibrium cycles as well as the number of repetitions. Likewise, the method of this invention may be applied to any doped semiconductor material that may be precipitated out of solution, including the currently most familiar commercial thermoelectric, based on bismuth telluride. To increase diffusion rates of the ions the solution temperatures can be increased to a range of 50-90 C.

In the most promising embodiments, anions may be of those provided by sulfides, selenides, tellurides, arsenides, or antimonides, even hydroxides (under simple basic conditions), or any combination of more than one of those depending on the end product desired. In the case of sulfide, one skilled in the art might utilize precursors such as thiosulfates, thiourea, thioacetamide, or any other reagent that would generate a sulfide equivalent in solution, including hydrosulfide or even dissolved hydrogen sulfide itself. Likewise, parallel reagents incorporating selenium and tellurium exist, selenosulfate, tellurosulfate, etc.

Cations may be any combination any of the transitional metals in groups 3-11 of the periodic table together any of the poor metals in groups 12-15, which exhibit thermoelectric properties as covalent mixed compounds, with individual elements acting either as the primary component, a minor component or a dopant. The cation mix in the sample procedure happens to be similar to known p-type materials as metal only alloys. Other potential formulations necessarily would include copper with combinations of zinc, antimony, tin, nickel and indium as materials for the primary cation mix, one example of which might be copper/zinc/nickel in the proportions 10/6/6. It is also possible by the method of this invention to deposit successive layers of semiconductor material of different composition, for example an outer ZnS shell for confinement of electron and hole wave functions.

It has been theorized that atomic level disorder is an indicator for reduced heat conductivity. Given that bismuth is such a prominent component of known high performance thermoelectrics, the various known low-melting bismuth alloys with various combinations of lead, tin, cadmium, indium and antimony, which form polyphase multi-component eutectics on their own, but which have never been specifically tested for thermoelectric potential as their covalent semiconducting mixed compounds with the anions mentioned here, deserve scrutiny as a basis for the cation mix of this invention, including the formulations in Table 1.

TABLE 1

Low Melting Bismuth Metal Alloys

| Melting Temp | Bismuth | Cadmium | Lead | Tin | Indium | Antimony |
|---|---|---|---|---|---|---|
| 47.2 C. | 44.7% | 5.3% | 22.6% | 8.3% | 19.1% | 0% |
| 57.8 C. | 49% | 0% | 18% | 12% | 21% | 0% |

TABLE 1-continued

Low Melting Bismuth Metal Alloys

| Melting Temp | Bismuth | Cadmium | Lead | Tin | Indium | Antimony |
|---|---|---|---|---|---|---|
| 60 C. | 47.5% | 9.5% | 25.4% | 12.6% | 5% | 0% |
| 62.2 C. | 32.5% | 0% | 0% | 16.5% | 51% | 0% |
| 63.9 C. | 48% | 9.6% | 25.6% | 12.8% | 4% | 0% |
| 70 C. | 50% | 10% | 26.7% | 13.3% | 0% | 0% |
| 70-87.8 C. | 42.5% | 8.5% | 37.7% | 11.3% | 0% | 0% |
| 95 C. | 52.5% | 0% | 32% | 15.5% | 0% | 0% |
| 100 C. | 39.4% | 0% | 29.8% | 30.8% | 0% | 0% |
| 102.8-226.7 C. | 48% | 0% | 28.5% | 14.5% | 0% | 9% |
| 123.8 C. | 55.5% | 0% | 44.5% | 0% | 0% | 0% |
| 138.3 C. | 58% | 0% | 0% | 42% | 0% | 0% |

While the base aerogel precursor material in the case of the sample procedure is pure silica, it might include as components oxides of titanium, aluminum or zirconium in particular, or just about any other metal or metalloid oxide. Or any of them might be used as the sole, main or a minor component, as one skilled in the current state of the art can now create aerogels from any of them. Any other aerogel of suitable low thermal and low electrical conductivity might be employed.

The rate at which the thin film layer of thermoelectric semiconductor material is deposited can be varied by the molar concentration of the ion reactants, as well as by complexing counter anions for the cations, which can also act to deposit a more smooth film if that is desired. The suggested molar concentration of reactant ions in the sample procedure can be taken as a mid range number, and can be varied by an order of magnitude or so either up or down depending on reagent choices. However, with sodium sulfide, for example, care must be taken in that higher concentrations can attack the backbone of a silica gel. In another embodiment a partially silica or non-silica aerogel precursor can be used that is more resistant.

In the sample procedure, there is natural surface complexing as each alternate ion layer is laid down, which tends to keep the layer in place while the alternate ions are diffusing in during the next equilibration stage. In addition, the added triethanolamine complexes and stabilizes the metal ions. But one skilled in the art might choose to add in the alternative hydrazine, ethylenediamine, chloride, cyanide, ammonia, citrate, oxalate, tartrate, EDTA, or any other similar acting complexing anion for this purpose, while maintaining an awareness of the solubility of all side products, or to have no complexing anions present at all.

So while the instant application may include specific compounding suggestions, the key to the fundamental novelty of this invention is not the particular selection of reagent components, but rather the construction of a continuous thin film layer of thermoelectric semiconductor material overlaid on an aerogel foundation evenly throughout its interior, and at least one particular practical method for achieving that structure.

In the case of a pure silica aerogel precursor, alternate procedures would also include base catalyzation of a silica solution, or TEOS/ethanol and TMOS/methanol systems to produce their respective precursor gels. As demonstrated by the alcohol systems (alcogels) just mentioned, neither is the method of this invention limited to aqueous only reaction conditions. For example, thioacetamide as the sulfide source can operate at room temperature also in pure ethanol with the appropriate choice of soluble metal salts, for example chlorides, for the cation sources. One skilled in the art might choose any solvent or combination of solvents that will dissolve the relatively low molar concentration of reactants required for this method, and still keep the side products in solution.

In one embodiment, the method of this invention exploits the fact that a freshly formed wet gel has very many existing exposed hydroxy functional groups, estimated at 5 per square nm of surface area, to coordinate with, and ultimately to anchor, the first layer of cations. By contrast, in a standard SILAR procedure the starting material hard substrate must be aggressively chemically and/or mechanically cleaned to facilitate this. A standard SILAR procedure specifies short immersion times on the order of 1 minute, whereas the method of this invention depends on long equilibration times to achieve even diffusion. Because of its immense internal surface area, a hydrogel or alcogel will draw in ions from the surrounding solution as needed even from a dilute solution. Another option would be to equilibrate in a more concentrated solution, and then to reverse equilibrate in pure solvent before the next corresponding ion equilibration. In this manner the gel only retains the quantity of ions it can fully surface coordinate.

One nice feature of the chalcogenides (the O, S, Se, and Te compounds) and other constituents of the end product compounds suggested is that many of them, besides being insoluble in water, exist as stable individual natural minerals, which bodes well for their endurance in a thermoelectric module application. As long as they are protected from extreme pH conditions, even the ones with poisonous elemental constituents are relatively non-toxic once formulated. It is also fortunate that antimonide in particular is already showing promise in thermoelectric bulk compounds, as the tellurium mostly used now is exceptionally rare on earth, on a par with gold or platinum, which might otherwise limit widespread deployment of this new thermoelectric technology.

While aerogels will support large weights compared to their own, they can be friable (subject to being shattered on a nanoscale), but the additional thermoelectric overlay tends to strengthen the whole. The melting point of silica aerogel is about 1,200 C, generally much higher than the thermoelectric layer, so with patience one may anneal the final thin film component to improve the smoothness of the layer for altering performance. One must be careful not to create capillary forces which might collapse the aerogel backbone. An inert atmosphere like nitrogen or argon, but which might be the same as the carbon dioxide retained in the aerogel at the conclusion of the supercritical drying step, helps to prevent decomposition during annealing. Such a process may be accomplished with induction or microwave heating to penetrate the interior of the aerogel.

There are some desirable dopants in some thermoelectric materials, for example elements like chlorine or potassium, which will not precipitate as insoluble materials from solution, or which would cause premature precipitation as in the case of a cation mix including lead or silver. In another embodiment these elements can be diffused into the thin film layer of semiconductor material during the annealing process, for example by including a corresponding halide gas in the annealing atmosphere, allowing it to equilibrate slowly, and then triggering and controlling the diffusion process with induction or microwave heating as already suggested.

The thickness of the thermoelectric layer may range from an atom or two thick, approaching a monolayer of about 0.2 nm, to about 10 nm, with a median of about 1-2 nm based on a presumed pore size distribution in the gel in the 8 nm range, but can vary proportionally to pore size based on the parameters of the gel preparation. By the method of this invention, each cycle of ion equilibrations deposits about 1 monolayer if the concentrations are kept low or back equilibrated, otherwise potentially more, with a rougher resulting surface.

For the final supercritical drying step another option is to supercritically dry directly from the ethanol, for which the critical point is 240.75 C and 60.6 atmospheres. Methanol or any other solvent with like properties might be used, but care must be taken that these elevated temperature and solvent conditions do not deteriorate the thermoelectric material in question. Depending on the thickness of the thermoelectric layer and the additional structural strength and hydrophobicity provided by that feature, the material may even be air dried under ambient conditions, optionally with the application of moderate heat and/or vacuum, with acceptable shrinkage levels, and trimmed to precise size with a diamond covered mini-saw.

Lastly, this applicant will close with a suggestion for a further modified and improved atomic layer deposition method which might have made the Edwards approach more feasible, which is this: One problem with attempting to apply ALD to an aerogel is managing heat distribution in such a thermally insulating material. This applicant proposes to use gentle induction or microwave heating to maintain the internal temperature of the aerogel at a moderately higher temperature than the incoming gases. Fine control could be achieved by combining infrared temperature sensing with a microprocessor control circuit. This might make other materials accessible like thin films of nitrides, carbides and silicides, which also have thermoelectric potential.

Those skilled in the art will appreciate that the present invention may be susceptible to variations and modifications other than those specifically described. It will be understood that the present invention encompasses all such variations and modifications that fall within its spirit and scope.

I respectfully claim:

1. A method of producing an aerogel composite continuous thin film layer thermoelectric semiconductor material comprising
   a) A wet phase formulation of an aerogel precursor gel,
   b) Equilibrating the said aerogel precursor gel in a solution of metallic cations such that they coordinate evenly as a layer with the surface of the said aerogel precursor gel throughout its interior,
   c) Equilibrating the said aerogel precursor gel in a solution of anions or anion equivalents that will deposit as an insoluble material upon reaction with the said metallic cations coordinated with the surface of the said aerogel precursor gel, whereupon additional anions or anion equivalents coordinate evenly as a layer with the surface of the said aerogel precursor gel throughout its interior,
   d) Repetition of steps 1(b) and 1(c), where
      (i) in step 1(b) the said metallic cations additionally react with any of the said anions or anion equivalents already coordinated with the surface of the said aerogel precursor gel throughout its interior and deposit as the said insoluble material,
      (ii) until a thin film layer of the said insoluble material of the desired even thickness is obtained throughout the interior of said aerogel precursor gel,
   e) Drying the said aerogel precursor gel to remove the liquid phase.

2. The method of claim 1 where the said drying is performed by supercritical drying.

3. The method of claim 1 where the said aerogel precursor gel is sufficiently strengthened and hydrophobic from the deposit of the said insoluble material that it can be dried under ambient conditions, or optionally with the application of moderate heat and/or vacuum.

4. The method of claim 1 where the thickness of the said aerogel precursor gel is 1 mm or greater.

5. The method of claim 1 where the said metallic cations are selected from the group of the transitional metals on the periodic table in groups 3-11 together with the poor metals on the periodic table in groups 12-15.

6. The method of claim 1 where the concentration of the said cations and the concentration of said anions or anion equivalents are optimally in the range of 0.05 to 0.20 molar.

7. The method of claim 1 where the optimum said even thickness is in the range of 0.2 nm to 10 nm.

8. The method of claim 5 where the said metallic cations comprise at least two different cations.

9. The method of claim 5 where in step 1(d) the repetition of step 1(b) is done with a solution of the said metallic cations of a different composition.

10. The method of claim 1 where complexing anions are added to the said solution of metallic cations to stabilize them.

11. The method of claim 1 where the said anions or anion equivalents are comprised of at least one selected from the group which will form a sulfide, selenide, telluride, arsenide, antimonide or an oxide.

12. The method of claim 11 where in step 1(d) the repetition of step 1(c) is done with a solution of the said anions or anion equivalents of different composition.

13. The method of claim 1 where after either of the steps 1(b) and 1(c) is performed, the said aerogel precursor gel is back equilibrated in pure solvent.

14. The method of claim 1 where the said aerogel precursor gel is comprised of silica.

15. The method of claim 1 where the said aerogel precursor gel contains the oxide of at least one metallic atom selected from the group of the transitional metals on the periodic table in groups 3-11 together with the poor metals on the periodic table in groups 12-15.

16. The method of claim 1 where after the said drying the said thin film layer is annealed using inductive or microwave heating.

17. The method of claim 16, done under an inert atmosphere.

18. The method of claim 16, done under an atmosphere that includes a gas component acting as a dopant of the said semiconductor material.

19. The method of claim 1 where at least one of the said solution of metallic cations or the said solution of anions or anion equivalents is raised to a temperature in the range of 50-90 C to increase diffusion rates.

20. An aerogel composite continuous thin film layer thermoelectric semiconductor material produced in accordance with the method of claim 1.

* * * * *